(12) United States Patent
Huang et al.

(10) Patent No.: US 12,736,583 B2
(45) Date of Patent: Sep. 15, 2026

(54) CHIP TESTING METHOD AND APPARATUS

(71) Applicant: XIAMEN INDUSTRIAL TECHNOLOGY RESEARCH INSTITUTE CO., LTD., Xiamen (CN)

(72) Inventors: Yonghong Huang, Xiamen (CN); Juilung Chen, Xiamen (CN); Yongbo Liu, Xiamen (CN); Huayi Liu, Xiamen (CN); Wenjie Su, Xiamen (CN)

(73) Assignee: XIAMEN INDUSTRIAL TECHNOLOGY RESEARCH INSTITUTE CO., LTD., Xiamen (CN)

( * ) Notice: Subject to any disclaimer, the term of this patent is extended or adjusted under 35 U.S.C. 154(b) by 195 days.

(21) Appl. No.: 18/912,642

(22) Filed: Oct. 11, 2024

(65) Prior Publication Data

US 2025/0147101 A1 May 8, 2025

(30) Foreign Application Priority Data

Nov. 2, 2023 (CN) ........................ 202311450388.0

(51) Int. Cl.

*G01R 31/317* (2006.01)
*G01R 1/067* (2006.01)
*G01R 1/073* (2006.01)
*G01R 31/02* (2006.01)
*G01R 31/3185* (2006.01)

(52) U.S. Cl.

CPC . *G01R 31/31724* (2013.01); *G01R 31/31713* (2013.01); *G01R 31/318555* (2013.01)

(58) Field of Classification Search

CPC ........ G01R 31/02; G01R 31/28; G01R 31/31; G01R 31/317; G01R 31/3185

See application file for complete search history.

(56) References Cited

U.S. PATENT DOCUMENTS

| | | | | |
|---|---|---|---|---|
| 9,640,279 | B1 * | 5/2017 | Popps | G11C 29/4401 |
| 2006/0276986 | A1 | 12/2006 | Anderson et al. | |
| 2022/0341991 | A1 * | 10/2022 | Lai | G11C 29/56 |

FOREIGN PATENT DOCUMENTS

| | | | |
|---|---|---|---|
| CN | 105975726 | A | 9/2016 |
| CN | 108614206 | A | 10/2018 |
| CN | 110554298 | A | 12/2019 |
| CN | 115078968 | A | 9/2022 |
| CN | 116298812 | A | 6/2023 |

* cited by examiner

*Primary Examiner* — Neel D Shah

(74) *Attorney, Agent, or Firm* — Bayramoglu Law Offices LLC

(57) ABSTRACT

A chip testing method and apparatus are provided, and the method includes: providing a plurality of chips, each of the chips including an input pin, an output pin, and a state machine circuit; connecting the input pin of each of the chips to a same input start module which outputs a start signal to each of the chips to start the state machine circuits; configuring the state machine circuit of each of the chips to output a test excitation to test the chips and obtain a test result; and connecting the output pin of each of the chips to a same testing module which outputs the test result of each of the chips.

10 Claims, 3 Drawing Sheets

CHIP TESTING METHOD AND APPARATUS

CROSS REFERENCE TO THE RELATED APPLICATIONS

This application is based upon and claims priority to Chinese Patent Application No. 202311450388.0, filed on Nov. 2, 2023, the entire contents of which are incorporated herein by reference.

TECHNICAL FIELD

The present disclosure relates to the field of electronic technology, and in particular to a chip testing method and apparatus.

BACKGROUND

Before mass production, multiple identical chips are tested one by one by using a traditional chip probe (CP) method or called wafer testing method, which is time-consuming and labor-intensive. To test multiple chips at the same time, a high-end test machine with a multi-channel probe card is required, which results in high testing costs.

SUMMARY

The present disclosure provides a chip testing method and apparatus, to at least solve the above technical problems in the related art.

According to a first aspect of the present disclosure, a chip testing method is provided, which includes:

- providing a plurality of chips, each of the chips including an input pin, an output pin and a state machine circuit;
- connecting the input pin of each of the chips to a same input start module which outputs a start signal to each of the chips to start the state machine circuits;
- configuring the state machine circuit of each of the chips to output a test excitation to test the chips and obtain a test result; and
- connecting the output pin of each of the chips to a same testing module which outputs the test result of each of the chips.

In an embodiment, the configuring the state machine circuit of each of the chips to output the test excitation to test the chips and obtain the test result may include:

- configuring the state machine circuits to output a first test excitation to cause the chips to generate a first output signal;
- configuring a reading unit in each of the chips to read the first output signal and compare the first output signal with the first test excitation; when the first output signal is identical with the first test excitation, determining that a test is completed; when the first output signal is different from the first test excitation, configuring the state machine circuits to output a second test excitation to cause the chips to generate a second output signal; and
- configuring the reading unit to read the second output signal and compare the second output signal with the second test excitation; when the second output signal is identical with the second test excitation, determining that the test is completed; when the second output signal is different from the second test excitation, configuring the state machine circuits to output a third test excitation to cause the chips to generate a third output signal, and repeating such operations until an N-th output signal is identical with an N-th test excitation; N is greater than or equal to 2, or a number of tests reaches a preset number of times.

In an embodiment, during the test of the chips, a pulse width of the N-th test excitation may be greater than a pulse width of an (N-1)th test excitation.

In an embodiment, the preset number of times may be less than or equal to 30.

In an embodiment, the connecting the output pin of each of the chips to the same testing module may include: connecting the output pin of each of the chips to a glue logic circuit; and coupling, by the glue logic circuit, the output pins of the plurality of chips to the testing module.

According to a second aspect of the present disclosure, a chip testing apparatus is provided, which includes:

- a plurality of chips, each of the chips including an input pin, an output pin and a state machine circuit;
- an input start module connected to the input pin of each of the chips, and configured to output a start signal to each of the chips to start the state machine circuits;
- the state machine circuit of each of the chips configured to output a test excitation to test the chips and obtain a test result; and
- a testing module connected to the output pin of each of the chips, and configured to output the test result of each of the chips.

In an embodiment, the state machine circuit of each of the chips configured to output the test excitation to test the chips and obtain the test result may include that:

- the state machine circuits are configured to output a first test excitation to cause the chips to generate a first output signal;
- a reading unit in each of the chips is configured to read the first output signal and compare the first output signal with the first test excitation; when the first output signal is identical with the first test excitation, it is determined that a test is completed; when the first output signal is different from the first test excitation, the state machine circuits are further configured to output a second test excitation to cause the chips to generate a second output signal; and
- the reading unit is further configured to read the second output signal and compare the second output signal with the second test excitation; when the second output signal is identical with the second test excitation, it is determined that the test is completed; when the second output signal is different from the second test excitation, the state machine circuits are configured to output a third test excitation to cause the chips to generate a third output signal, and such operations are repeated until an N-th output signal is identical with an N-th test excitation; N is greater than or equal to 2, or a number of tests reaches a preset number of times.

In an embodiment, during the test of the chips, a pulse width of the N-th test excitation may be greater than a pulse width of an (N-1)th test excitation.

In an embodiment, the preset number of times may be less than or equal to 30.

In an embodiment, the apparatus may further include:

- a glue logic circuit connected to the output pin of each of the chips; and the glue logic circuit may be configured to couple the output pins of the plurality of chips to the testing module.

In the chip testing method and apparatus of the present disclosure, the built-in self-test state machine circuit of each of the chips is started by means of a common input start module, so that the state machine circuits generate a test excitation to complete the test, and the test result(s) may be output by means of a common testing module, thereby achieving the purpose of CP testing multiple chips at the same time, and greatly reducing the use of expensive multi-channel test machines during testing. The relevant tests can be completed by using ordinary machines, thereby reducing the test cost.

It should be understood that the content described in this section is not intended to identify critical or important features of the embodiments of the present disclosure, and is not used to limit the scope of the present disclosure either. Other features of the present disclosure will be easily understood through the following description.

BRIEF DESCRIPTION OF THE DRAWINGS

By reading the following detailed description with reference to the accompanying drawings, the above and other objectives, features and advantages of the exemplary embodiments of the present disclosure will become easier to understand. In the drawings, a number of embodiments of the present disclosure are shown in an exemplary and non-limiting manner, in which.

in the drawings, the same or corresponding reference numerals denote the same or corresponding parts.

DETAILED DESCRIPTION OF THE EMBODIMENTS

In order to make the objectives, features, and advantages of the present disclosure more apparent and easier to understand, the technical solutions in the embodiments of the present disclosure will be clearly and completely described below with reference to the accompanying drawings in the embodiments of the present disclosure. Apparently, the embodiments described are only some of the embodiments of the present disclosure, not all of them. All other embodiments obtained by those skilled in the art based on the embodiments of the present disclosure without any creative efforts shall fall within the protection scope of the present disclosure.

Figure 1:
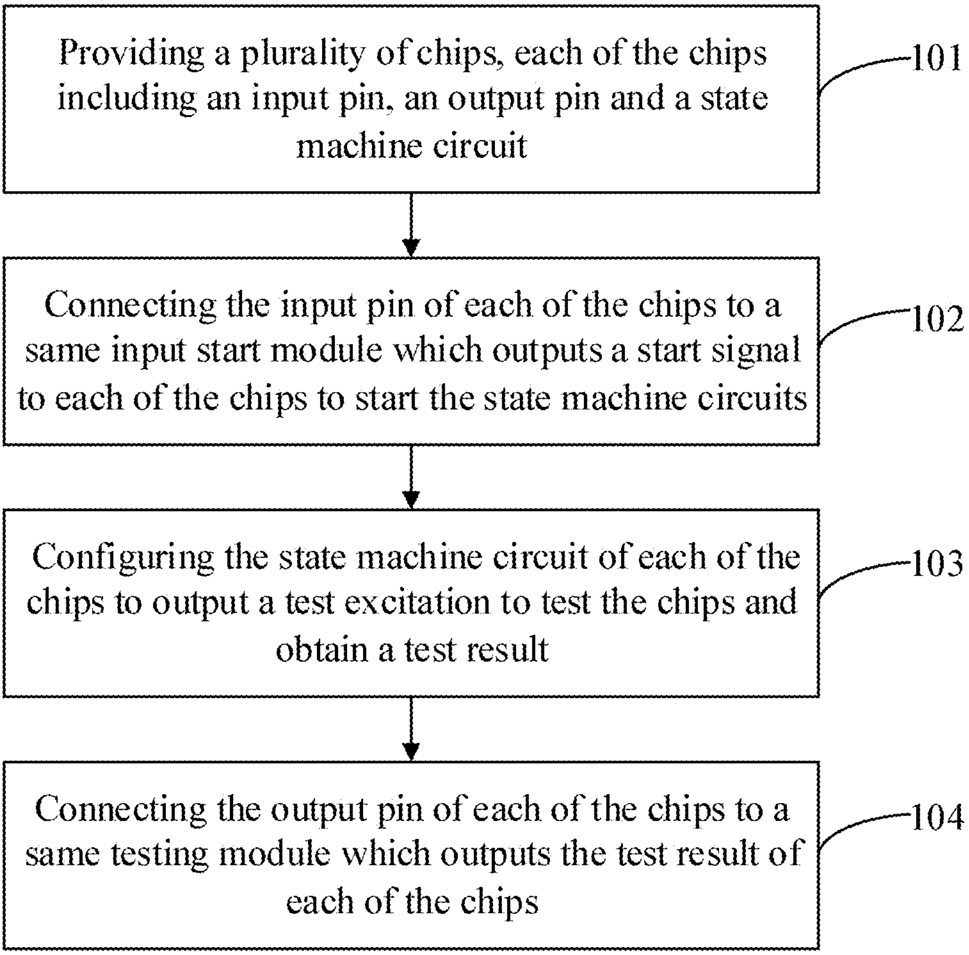
FIG. 1 shows a flowchart of a chip testing method according to an embodiment of the present disclosure.

An embodiment of the present disclosure provides a chip testing method. FIG. 1 shows a flowchart of a chip testing method according to an embodiment of the present disclosure. As shown in FIG. 1, the chip testing method includes the following steps:

- step 101: providing a plurality of chips, each of the chips including an input pin, an output pin and a state machine circuit;
- step 102: connecting the input pin of each of the chips to a same input start module which outputs a start signal to each of the chips to start the state machine circuits;
- step 103: configuring the state machine circuit of each of the chips to output a test excitation to test the chips and obtain a test result; and
- step 104: connecting the output pin of each of the chips to a same testing module which outputs the test result of each of the chips.

The chip testing method provided by this embodiment of the present disclosure will be further described in detail below in combination with specific embodiments.

Figure 2:
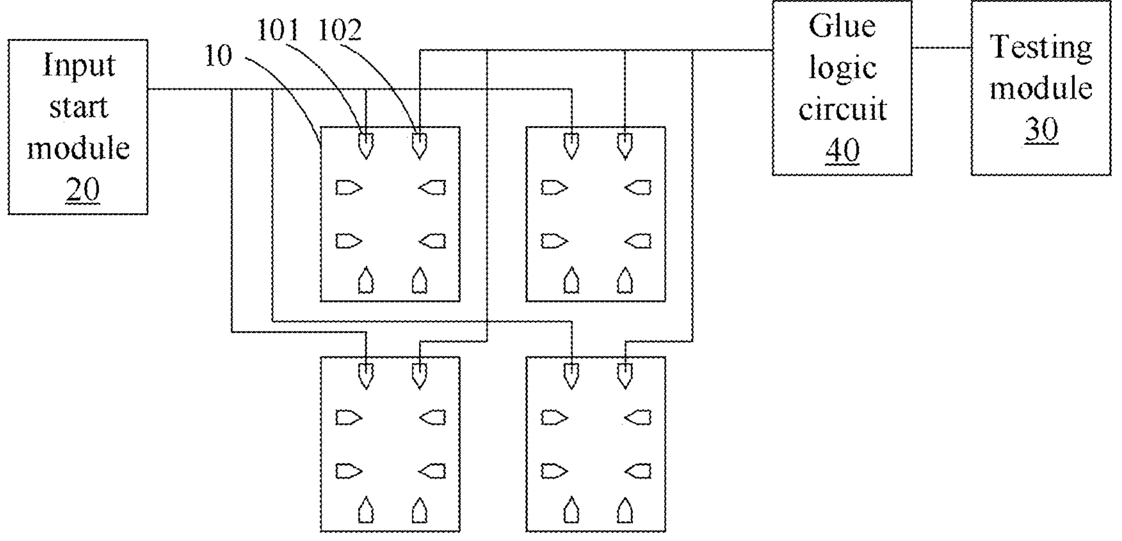
FIG. 2 shows a structural diagram of a chip testing apparatus according to an embodiment of the present disclosure.

Referring to FIG. 2, step 101 is performed to provide a plurality of chips 10, and each of the chips 10 includes an input pin 101, an output pin 102 and a state machine circuit (not shown).

As shown in FIG. 2, in addition to the input pin 101 and the output pin 102, each of the chips 10 includes other pins which can be used for other functions.

In this embodiment, as shown in FIG. 2, four chips are taken as an example for description. In other embodiments, other numbers of chips may be used, such as 8 or 16.

Next, referring to FIG. 2, step 102 is performed to connect the input pin 101 of each of the chips 10 to a same input start module 20 which outputs a start signal to each of the chips 10 to start the state machine circuits.

The input pins 101 of the plurality of chips 10 to be tested are connected together and connected to the same input start module 20. The input start module 20 outputs a start signal and transmits the start signal to each of the chips 10 to start the state machine circuit in each of the chips 10.

The input start module 20 may be a pad. The start signal output by the input start module 20 is a high-level single pulse signal. After being transmitted to the chips 10, the start signal starts the state machine circuits instead of generating a test excitation/vector.

Then, step 103 is performed to configure the state machine circuit of each of the chips 10 to output a test excitation to test the chips 10, and a test result is obtained.

In an embodiment, the configuring the state machine circuit of each of the chips 10 to output a test excitation to test the chips 10 and obtain a test result includes:

- configuring the state machine circuits to output a first test excitation to cause the chips 10 to generate a first output signal;
- configuring a reading unit (not shown) in each of the chips 10 to read the first output signal and compare the first output signal with the first test excitation; if the first output signal is identical with the first test excitation, determining that a test is completed; if the first output signal is different from the first test excitation, configuring the state machine circuits to output a second test excitation to cause the chips 10 to generate a second output signal; and
- configuring the reading unit to read the second output signal and compare the second output signal with the second test excitation; if the second output signal is identical with the second test excitation, determining that the test is completed; if the second output signal is different from the second test excitation, configuring the state machine circuits to output a third test excitation to cause the chips 10 to generate a third output signal, and repeating such operations until an N-th output signal is identical with an N-th test excitation; N is greater than or equal to 2, or a number of tests reaches a preset number of times.

Figure 3:
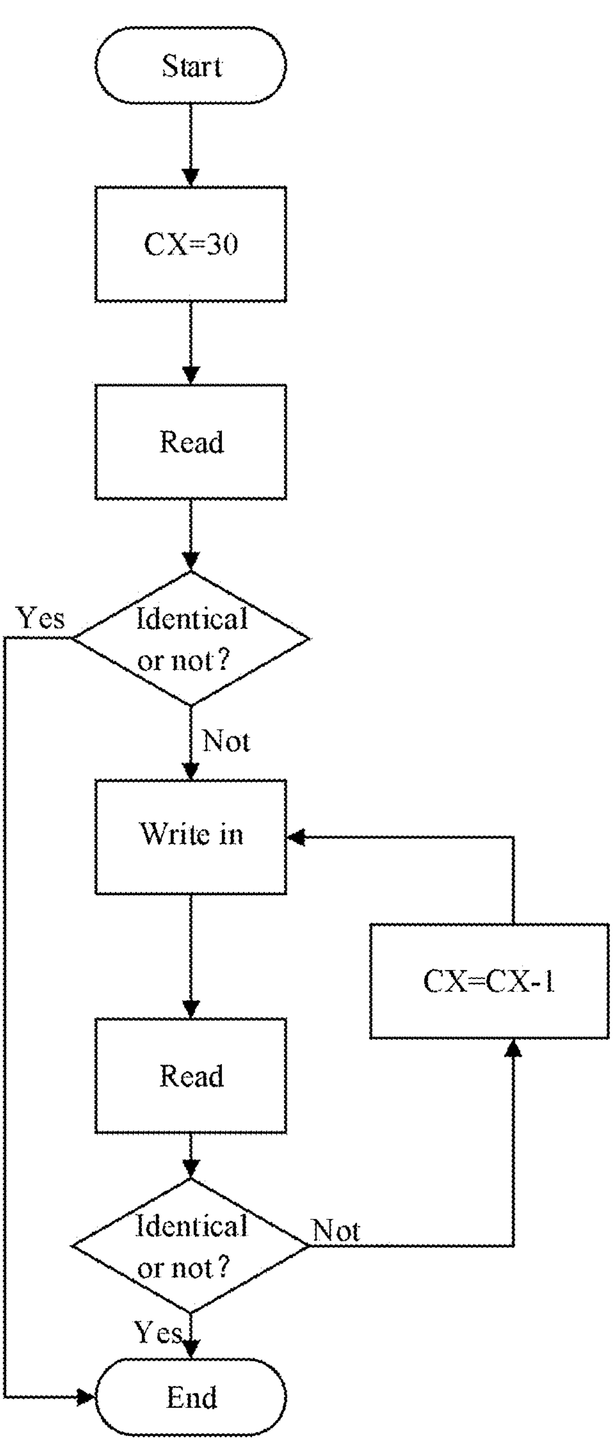
FIG. 3 is a working flowchart of a state machine circuit according to an embodiment of the present disclosure.

FIG. 3 is a working flowchart of a state machine circuit according to an embodiment of the present disclosure. As shown in FIG. 3, after the state machine circuits are started, a maximum of 30 test attempts are made (i.e., CX=30 in FIG. 3), that is, the preset number of times is less than or equal to 30.

After a first test of the state machine circuits begins, a test excitation is output for the first time, that is, the first test excitation is output, to cause the chips 10 to generate the first output signal(s). The reading unit in the chip 10 reads the first output signal and compares the first output signal with the first test excitation. If the first output signal is identical with the first test excitation, the test is completed, and it is indicated that there is no problem with the performance of the chip; if the first output signal is different from the first test excitation, a second test is performed. In particular, for example, if the first test excitation is 1 and the first output signal read is 1, it means that the first test excitation is identical with the first output signal and there is no problem with the performance of the chip, and then the test can be terminated; if the first test excitation is 1 but the first output signal read is 0, it means that the first test excitation is not identical with the first output signal, and a test needs to be conducted again.

In an embodiment, during the test of the chip 10, a pulse width of the N-th test excitation is greater than that of an (N-1)th test excitation.

During the second test, the state machine circuit(s) may output a second test excitation, and the pulse width of the second test excitation is greater than that of the first test excitation. According to the second test excitation, the chip 10 generates a second output signal. The reading unit reads the second output signal and compares the second output signal with the second test excitation. If the second output signal is identical with the second test excitation, a test result is terminated, and it means that there is no problem with the performance of the chip; if the second output signal is not identical with the second test excitation, the test is conducted again.

Such an operation is repeated until a test excitation is identical with a corresponding output signal in a certain test or until the number of test times reaches the preset number of times. If the number of test times reaches the preset number of times, but the test excitation is still different from the output signal, it means that there is a problem with the chip, and it is a defective product.

During the test process, the pulse width of the test excitations gradually increases, that is, the pulse width of the subsequent test excitation is greater than that of the previous test excitation, so as to enhance the writing intensity.

In an embodiment of the present disclosure, the state machine circuit in each of the chips can independently and in parallel complete the testing of each of the chips, thereby achieving the effect of testing a plurality of chips at the same time.

Referring to FIG. 2, step 104 is performed to connect the output pin 102 of each of the chips 10 to a same testing module 30 which outputs the test result of each of the chips 10.

In an embodiment, the connecting the output pin of each of the chips 10 to the same testing module 30 includes: connecting the output pin of each of the chips 10 to a glue logic circuit 40; and coupling, by the glue logic circuit 40, the output pins of the plurality of chips 10 to the testing module 30.

The output pins of all the chips 10 are gathered by means of the glue logic circuit 40, and then connected to the testing module 30, so that the output can be analyzed by the testing module 30 to obtain the test result. The testing module 30 may be TestLine.

In a specific embodiment, taking the simultaneous testing of two 8-IO chips as an example, in a traditional method, an 8*2-channel test machine is required, while in the embodiment of the present disclosure, an ordinary 8-channel machine may be used to self-test most functions by means of the built-in self-test state machine circuit(s), and a 16-channel machine is used to test a small number of properties. Assuming that the total test machine time is T, the test time of an ordinary machine accounts for 0.9, the test time of a 16-channel machine accounts for 0.1, the machine time cost of the multi-channel machine is X, and the machine time cost of the ordinary machine is Y (Y is far less than X), then the testing cost of the chip testing method in the embodiments of the present disclosure is calculated by 0.9T*Y+0.1T*X, while in the traditional test, it costs X*T, showing that the chip testing method provided by the embodiments of the present disclosure can greatly reduce the testing cost.

An embodiment of the present disclosure further provides a chip testing apparatus. As shown in FIG. 2, the chip testing apparatus includes:

- a plurality of chips 10, each of the chips 10 including an input pin 101, an output pin 102 and a state machine circuit;
- an input start module 20 connected to the input pin 101 of each of the chips 10; and
- the input start module 20 is configured to output a start signal to each of the chips 10 to start the state machine circuits;
- the state machine circuit of each of the chips 10 configured to output a test excitation to test the chips 10 and obtain a test result; and
- a testing module 30 connected to the output pin 102 of each of the chips 10; and the testing module 30 is configured to output the test result of each of the chips 10.

As shown in FIG. 2, in addition to the input pin 101 and the output pin 102, each of the chips 10 includes other pins which can be used for other functions.

In this embodiment, as shown in FIG. 2, four chips are taken as an example for description. In other embodiments, other numbers of chips may be used, such as 8 or 16.

The input pins 101 of the plurality of chips 10 to be tested are connected together and connected to the same input start module 20. The input start module 20 outputs a start signal and transmits the start signal to each of the chips 10 to start the state machine circuit in each of the chips 10.

The input start module 20 may be a pad. The start signal output by the input start module 20 is a high-level single pulse signal. After being transmitted to the chips 10, the start signal starts the state machine circuits instead of generating a test excitation.

In an embodiment, the state machine circuit of each of the chips 10 configured to output a test excitation to test the chips 10 and obtain a test result includes:

- the state machine circuits are configured to output a first test excitation to cause the chips 10 to generate a first output signal;
- a reading unit in each of the chips is configured to read the first output signal and compare the first output signal with the first test excitation; if the first output signal is identical with the first test excitation, it is determined that a test is completed; if the first output signal is different from the first test excitation, the state machine circuits are further configured to output a second test excitation to cause the chips 10 to generate a second output signal; and
- the reading unit is further configured to read the second output signal and compare the second output signal with the second test excitation; if the second output signal is identical with the second test excitation, it is determined that the test is completed; if the second output signal is different from the second test excitation, the state machine circuits are configured to output a third test excitation to cause the chips 10 to generate a third output signal, and repeating such operations until an N-th output signal is identical with an N-th test excitation; N is greater than or equal to 2, or the number of tests reaches a preset number of times.

As shown in FIG. 3, after the state machine circuits are started, a maximum of 30 test attempts are made, that is, a preset number of times is less than or equal to 30.

After a first test of the state machine circuits begins, a test excitation is output for the first time, that is, the first test excitation is output, to cause the chips 10 to generate the first output signal. The reading unit in the chip 10 reads the first output signal and compares the first output signal with the first test excitation. If the first output signal is identical with the first test excitation, the test is completed, and it is indicated that there is no problem with the performance of the chip; if the first output signal is different from the first test excitation, a second test is performed. In particular, for example, if the first test excitation is 1 and the first output signal read is 1, it means that the first test excitation is identical with the first output signal and there is no problem with the performance of the chip, and then the test can be terminated; if the first test excitation is 1 but the first output signal read is 0, it means that the first test excitation is not identical with the first output signal, and a test needs to be conducted again.

In an embodiment, during the test of the chip 10, a pulse width of the N-th test excitation is greater than that of an (N−1)th test excitation.

During the second test, the state machine circuit(s) may output a second test excitation; and the pulse width of the second test excitation is greater than that of the first test excitation. According to the second test excitation, the chip 10 generates a second output signal. The reading unit reads the second output signal and compares the second output signal with the second test excitation. If the second output signal is identical with the second test excitation, a test result is obtained, and it means that there is no problem with the performance of the chip; if the second output signal is not identical with the second test excitation, the test is conducted again.

Such an operation is repeated until a test excitation is identical with a corresponding output signal in a certain test or until the number of test times reaches the preset number of times. If the number of test times reaches the preset number of times, but the test excitation is still different from the output signal, it means that there is a problem with the chip and it is a defective product.

During the test process, the pulse width of the test excitations gradually increases, that is, the pulse width of the subsequent test excitation is greater than that of the previous test excitation, so as to enhance the writing intensity.

In an embodiment of the present disclosure, the state machine circuit in each of the chips can independently and in parallel complete the testing of each of the chips, thereby achieving the effect of testing a plurality of chips at the same time.

In an embodiment, the chip testing apparatus further includes: a glue logic circuit 40 connected to the output pin 102 of each of the chips 10, and the glue logic circuit 40 is configured to couple the output pins 102 of the plurality of chips 10 to the testing module 30.

The output pins of all the chips 10 are gathered by means of the glue logic circuit 40, and then connected to the testing module 30, so that the output can be analyzed by the testing module 30 to obtain the test result. The testing module 30 may be TestLine.

In an embodiment of the present disclosure, the built-in self-test state machine circuit of each of the chips is started by means of a common input start module, so that the state machine circuits generate a test excitation to complete the test, and the test result(s) may be output by means of a common testing module, thereby achieving the purpose of CP testing multiple chips at the same time, and greatly reducing the use of expensive multi-channel test machines during testing. The relevant tests can be completed by using ordinary machines, thereby reducing the test cost.

It should be understood that the steps may be reordered, added, or deleted by using the flows in various forms, which are shown above. For example, the steps recorded in the present disclosure may be performed concurrently, in order, or in a different order, provided that the desired result of the technical solutions disclosed in the present disclosure can be achieved, which is not limited herein.

In addition, the terms "first" and "second" are merely used for description purposes and cannot be interpreted as indicating or implying relative importance or implicitly indicating the number of technical features indicated. Therefore, the features defined with "first" and "second" can explicitly or implicitly include one or more features. In the description of the present disclosure, "a plurality of" means two or more than two, unless otherwise specified.

What are described above are merely being particular embodiments of the present disclosure, and are not intended to limit the scope of protection of the present disclosure, and any changes or substitutions that can readily occur to those skilled in the art within the scope of technology disclosed in the present disclosure should fall within the scope of protection of the present disclosure. Therefore, the scope of protection of the present disclosure shall be subject to the scope of protection of the claims.

What is claimed is:

1. A chip testing method, comprising:

providing a plurality of chips, wherein each of the plurality of chips comprises an input pin, an output pin, and a state machine circuit;

connecting the input pin of each of the plurality of chips to an identical input start module, wherein the identical input start module outputs a start signal to each of the plurality of chips to start the state machine circuits;

configuring the state machine circuit of each of the plurality of chips to output a test excitation to test the plurality of chips and obtain a test result; and connecting the output pin of each of the plurality of chips to an identical testing module, wherein the identical testing module outputs the test result of each of the plurality of chips.

2. The chip testing method according to claim 1, wherein a step of configuring the state machine circuit of each of the plurality of chips to output the test excitation to test the plurality of chips and obtain the test result comprises:

configuring the state machine circuits to output a first test excitation to cause the plurality of chips to generate a first output signal;

configuring a reading unit in each of the plurality of chips to read the first output signal and compare the first output signal with the first test excitation; when the first output signal is identical with the first test excitation, determining that a first test is completed; when the first output signal is different from the first test excitation, configuring the state machine circuits to output a second test excitation to cause the plurality of chips to generate a second output signal; and configuring the reading unit to read the second output signal and compare the second output signal with the second test excitation; when the second output signal is identical with the second test excitation, determining that a second test is completed; when the second output signal is different from the second test excitation, configuring the state machine circuits to output a third test excitation to cause the plurality of chips to generate a third output signal, and repeating such operations until an N-th output signal is identical with an N-th test excitation, wherein N is greater than or equal to 2, or a number of tests reaches a preset number of times.

3. The chip testing method according to claim 2, wherein during the tests of the plurality of chips, a pulse width of the N-th test excitation is greater than a pulse width of an (N−1)th test excitation.

4. The chip testing method according to claim 2, wherein the preset number of the times is less than or equal to 30.

5. The chip testing method according to claim 1, wherein a step of connecting the output pin of each of the plurality of chips to the identical testing module comprises: connecting the output pin of each of the plurality of chips to a glue logic circuit; coupling, by the glue logic circuit, the output pins of the plurality of chips to the identical testing module.

6. A chip testing apparatus, comprising:

a plurality of chips, wherein each of the plurality of chips comprises an input pin, an output pin, and a state machine circuit;

an input start module connected to the input pin of each of the plurality of chips, and configured to output a start signal to each of the plurality of chips to start the state machine circuits;

the state machine circuit of each of the plurality of chips configured to output a test excitation to test the plurality of chips and obtain a test result; and a testing module connected to the output pin of each of the plurality of chips, and configured to output the test result of each of the plurality of chips.

7. The chip testing apparatus according to claim 6, wherein the state machine circuit of each of the plurality of chips configured to output the test excitation to test the plurality of chips and obtain the test result comprises that:

the state machine circuits are configured to output a first test excitation to cause the plurality of chips to generate a first output signal;

a reading unit in each of the plurality of chips is configured to read the first output signal and compare the first output signal with the first test excitation; when the first output signal is identical with the first test excitation, it is determined that a first test is completed; when the first output signal is different from the first test excitation, the state machine circuits are further configured to output a second test excitation to cause the plurality of chips to generate a second output signal; and the reading unit is further configured to read the second output signal and compare the second output signal with the second test excitation; when the second output signal is identical with the second test excitation, it is determined that a second test is completed; when the second output signal is different from the second test excitation, the state machine circuits are configured to output a third test excitation to cause the plurality of chips to generate a third output signal, and such operations are repeated until an N-th output signal is identical with an N-th test excitation, wherein N is greater than or equal to 2, or a number of tests reaches a preset number of times.

8. The chip testing apparatus according to claim 7, wherein during the tests of the plurality of chips, a pulse width of the N-th test excitation is greater than a pulse width of an (N−1)th test excitation.

9. The chip testing apparatus according to claim 7, wherein the preset number of the times is less than or equal to 30.

10. The chip testing apparatus according to claim 6, further comprising:

a glue logic circuit connected to the output pin of each of the plurality of chips, wherein the glue logic circuit is configured to couple the output pins of the plurality of chips to the testing module.

* * * * *